United States Patent
Crane et al.

(10) Patent No.: US 12,546,833 B2
(45) Date of Patent: Feb. 10, 2026

(54) ELECTRIC COMPONENT COMPARISON APPARATUS, SYSTEM, AND RELATED METHODS

(71) Applicant: Coilcraft, Incorporated, Cary, IL (US)

(72) Inventors: Leonard Crane, Crystal Lake, IL (US);
Ying Lou, Buffalo Grove, IL (US);
Christopher J. Hare, McHenry, IL (US)

(73) Assignee: Coilcraft Incorporated, Cary, IL (US)

( * ) Notice: Subject to any disclaimer, the term of this patent is extended or adjusted under 35 U.S.C. 154(b) by 236 days.

(21) Appl. No.: 18/381,356

(22) Filed: Oct. 18, 2023

(65) Prior Publication Data
US 2024/0125869 A1 Apr. 18, 2024

Related U.S. Application Data

(60) Provisional application No. 63/417,083, filed on Oct. 18, 2022.

(51) Int. Cl.
*G01R 31/56* (2020.01)
*G01R 31/317* (2006.01)
*G01R 31/319* (2006.01)

(52) U.S. Cl.
CPC ....... *G01R 31/56* (2020.01); *G01R 31/31703* (2013.01); *G01R 31/31704* (2013.01); *G01R 31/31912* (2013.01)

(58) Field of Classification Search
None
See application file for complete search history.

(56) References Cited

U.S. PATENT DOCUMENTS 11,349,396 B2 * 5/2022 Couleur .............. H02M 1/0064

OTHER PUBLICATIONS

Wurth Electronics Component Comparison Tool, publicly available before Oct. 18, 2022, 1 p.
Sunlord Component Comparison Tool, publicly available before Oct. 18, 2022, 1 p.

* cited by examiner

*Primary Examiner* — Jermele M Hollington
(74) *Attorney, Agent, or Firm* — Fitch, Even, Tabin & Flannery LLP

(57) ABSTRACT

An electronic component comparison apparatus is disclosed for comparing performance characteristics of the electronic components at different operating conditions. The electronic component comparison apparatus includes a processor that receives input of a first electronic component and a first operating condition and receives input of a second electronic component and a second operating condition where the second operating condition may be different from the first operating condition. The processor estimates a first electronic component performance characteristic based at least in part on the first electronic component and the first operating condition and estimates a second electronic component performance characteristic based at least in part on the second electronic component and the second operating condition. The processor outputs the first electronic component performance characteristic and second electronic component performance characteristic via a user interface for comparison.

24 Claims, 8 Drawing Sheets

| Part Number | L | Idc | Ip-p | F | Lat 2.4 A (µH) | L Nominal (µH) | Isat @ 25°C (A) | Irms 40°C Rise @ 25°C (A) | DCR typ @ 25°C (A) |
|---|---|---|---|---|---|---|---|---|---|
| | | | | | × → | × ← | × → | × → | × → |
| Check Parts Below To Analyze | | | | | | | | | |
| ☑ XGL4020-102 (Sample) (Buy) | 1.0 µH | 2A | .8 A | 1000 kHz | 0.96 | 1.0 | 8.8 | 12.0 | 8.2 |
| ☑ XGL4020-102 (Sample) (Buy) | 1.0 µH | 2A | .4 A | 2000 kHz | 0.96 | 1.0 | 8.8 | 12.0 | 8.2 |

Example 1 Results

FIG. 3B

ELECTRIC COMPONENT COMPARISON APPARATUS, SYSTEM, AND RELATED METHODS

CROSS-REFERENCE TO RELATED APPLICATIONS

This application claims benefit of U.S. Provisional Application No. 63/417,083, filed Oct. 18, 2022, which is hereby incorporated herein by reference in its entirety.

FIELD

This disclosure relates to calculating electronic component performance and, in particular, to a tool for comparing the performance of multiple inductors based on various operating parameters to assist in determining which is appropriate for a particular application.

BACKGROUND

Many operating characteristics of an inductor change based on the current operating conditions of the inductor. For example, operating characteristics such as the inductance, impedance, and efficiency of the inductor are dependent on the current operating conditions of the inductor (e.g., frequency, current, temperature). As a result, predicting the efficiency (or power losses) of an inductor is challenging as the operating characteristics of the inductor change as the operating conditions change. Circuit designers desire tools to facilitate an evaluation and selection of inductors for use in a circuit that will operate as desired.

DETAILED DESCRIPTION

Figure 1:
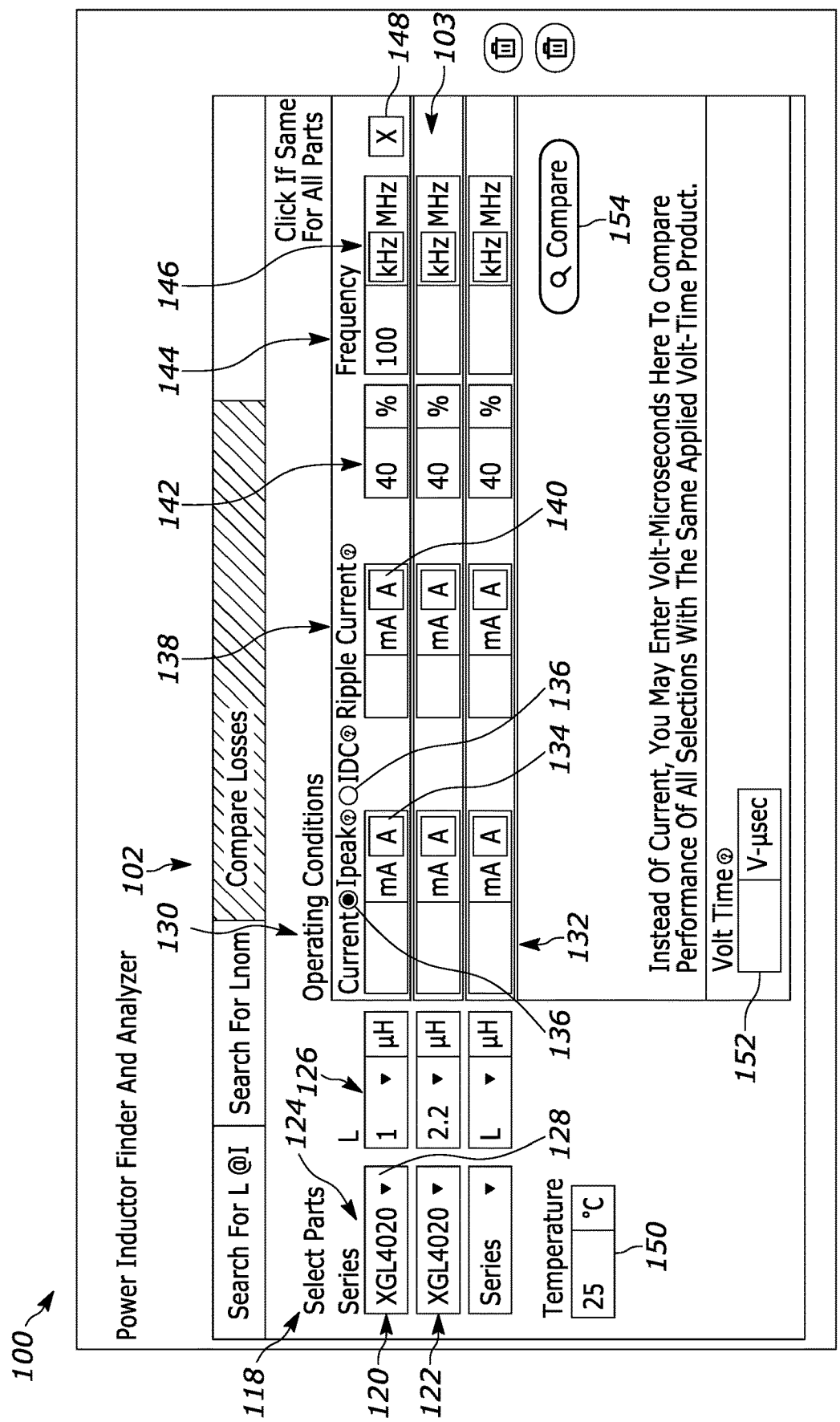
FIG. 1 is an input interface of an inductor comparison system.

Disclosed is an electronic component comparison apparatus, system and methods related to same. Apparatus, systems and methods are disclosed relating to calculating electronic component performance and, in particular, to a tool for comparing the performance of multiple inductors based on various operating parameters to assist in determining which is appropriate for a particular application. In one form, a design tool is provided that allows for predicting the efficiency (or power losses) of an inductor or inductors by entering in operating condition parameters including frequency, current, and environmental temperature. Parameters that change with operating conditions include inductance, impedance, and losses (opposite of efficiency). Unlike existing design tools that allow a user to input certain operating conditions and calculate performance, this design tool is not limited to adjusting parameters of average current, ripple (varying) current, and the frequency of how fast the current is varying. Such existing tools allow a user to analyze the expected efficiency of a particular inductor and/or compare performance of multiple selected inductors, but they require the user to input a single set of operating conditions, under which the performance of all selected inductors could be compared. For example, an existing design tool may allow a user to compare the performance of three inductors, all under the same operating conditions of 2 amperes average current and 0.8 amperes of ripple current that varies at a frequency of 100 kHz. However, if it is desired to analyze different inductors under different operating conditions, the user must run the analyzer multiple times and then manually compare any results. Conversely, the new design tool disclosed herein allows a user to eliminate the restriction that all inductors be compared under the same operating conditions. In one embodiment, the user will be allowed to select the same operating conditions for all selected inductors but will also be allowed to specify operating conditions for each inductor separately. The calculations for each scenario are done concurrently and the designer is presented the various results together for comparison. Because of the interdependent nature of the inductor parameters and the operating conditions, it is useful if a user (or designer) can consider and compare different inductors at different operating conditions to find the "sweet spot" of a design. Thus, with this new tool a user/designer can compare different circuit operating scenarios and have a much larger impact on the circuit design choices much earlier in the design process before inductance value has been defined. Although examples are provided herein that reference comparing different inductors to one another, it should be understood that the design tool disclosed herein can be used with other electronic components. Further, it should be understood that the design tool can be used to compare the same type of electronic component (e.g., the same type of inductor), but using different parameters so that the various application scenarios it is exposed to can be compared together. For example, the design tool may be used to compare three of the same inductors, but at different environmental or application characteristics for each so that the designer can determine what the optimal environment is for the inductor if desired.

With respect to FIG. 1, an inductor comparison tool 100 is provided that permits a user to compare performance characteristics of two or more inductors. The inductor comparison tool 100 may be a software program having an input interface 102 that permits the user to input data about the inductors to be compared along with a set of operating conditions for each inductor. The inductor comparison tool 100 outputs performance characteristics for each inductor based on the characteristics of the inductor and the operating conditions.

The inductor comparison tool 100 is useful for circuit designers seeking to find a particular inductor to use in a circuit. A circuit designer is often in search of a particular inductance value when a circuit design has otherwise been determined. In many applications, the inductance value of an inductor itself indicates the amount of ripple current that flows through the inductor. Because of the interdependent nature of the inductor performance parameters and the operating conditions, it is useful if a designer can consider and compare different inductors at different operating conditions to find the "sweet spot" of design.

The inductor comparison tool 100 also enables the user to compare different circuit operating scenarios and to have more latitude in making circuit design choices earlier in the design process before an inductance value has been defined. The inductor comparison tool 100 permits a user to compare inductors under the same or different operating conditions. The calculations for each scenario are done concurrently and the designer is presented the various results together for comparison and evaluation of the inductors.

Figure 2:
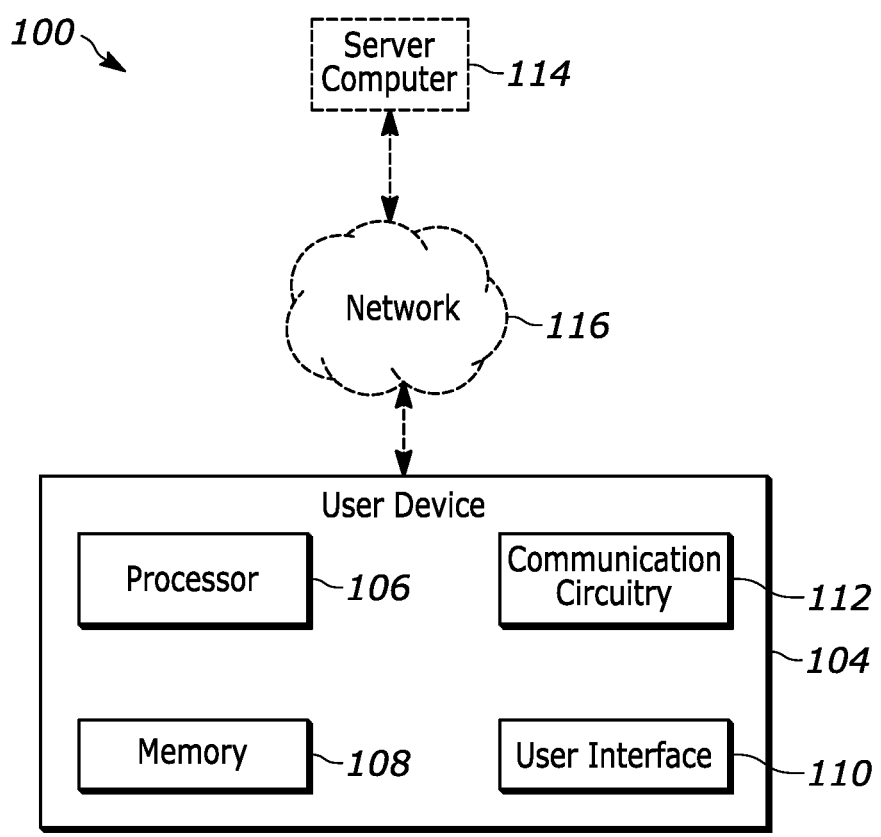
FIG. 2 is a schematic drawing of the inductor comparison system of FIG. 1.

With respect to FIG. 2, the inductor comparison tool 100 may be operated by a user on a user device 104. The inductor comparison tool 100 may be a system including the user device 104 operating in conjunction with a remote computing device, such as server computer 114. The user device 104 may be a personal computer, smartphone, or other computing device.

The user device 104 includes a processor 106 and a memory 108. The memory 108 is a non-transitory computer readable media that may store programs, instructions, and information to operate functionality and features of the user device 104 and the inductor comparison tool 100. The processor 106 is configured to access the memory 108 to receive information from memory 108 and write or store information to memory 108. The user device 104 may include a user interface 110 in communication with the processor 106 for presenting information to a user and for receiving input from a user. The user interface 110 may include a display screen (e.g., a touchscreen display), a keyboard, a microphone and/or a speaker 125 as examples. The processor 106 may control a display screen of the user interface 110 to present the input interface 102 to the user. The processor 106 may receive input from a user inputting information about the inductors to be compared and operating conditions via the user interface 110.

The user device 104 may include communication circuitry 112 for communicating with remote computing devices, such as the server computer 114. The processor 106 is in communication with the communication circuitry 112 and may control the communication circuitry 112 to send and receive information to and from the server computer 114. The communication circuitry 112 may enable the user device 104 to communicate over wired or wireless protocols, for example, ethernet, wireless fidelity (Wi-Fi), and/or cellular.

The user device 104 may communicate with the server computer 114 over one or more wired or wireless networks 116, such as a cellular network and/or the internet to carry out the steps for comparing inductors described in further detail below. In some forms, the server computer 114 stores and executes functions of the inductor comparison tool 100 remotely from the user device 104. For example, the inductor comparison tool 100 may be accessed using the user device 104 via the internet. For instance, a web browser of the user device 104 may be used to open a website providing access to the inductor comparison tool 100. The user may operate the user device 104 to navigate to the website including the inductor comparison tool 100 to use the inductor comparison tool 100. Upon accessing the website associated with the inductor comparison tool 100, the input interface 102 may be presented to the user on the web browser of the user device 104. The user may enter information into the input interface 102 of the inductor comparison tool 100 remotely using the user interface of the user device 104. The user device 104 communicates the input data to the server computer 114 (e.g., via the network 116).

Similarly, when the inductor comparison tool 100 outputs results of the inductor comparison, the user device 104 receives the results from the server computer 114 (e.g., via the network 116) and presents them to the user via the user interface 110. The server computer 114 may thus process the input information on the backend or remotely from the user device 104.

As another example, the inductor comparison tool 100 is an application (e.g., a smartphone application) installed on the user device 104. The user may operate the user device 104 to open the application when they desire to use the inductor comparison tool 100. The application may present the user with the input interface 102 where the user may enter information about the inductors the user desires to compare. In some forms, the application installed on the user device includes code for comparing the inductors without needing to communicate the input data to server computer 114, for example, a server computer associated with the application. In some forms, the user device 104 operates in conjunction with the server computer 114 to provide functionality to the inductor comparison tool 100. For instance, the user device 104 may receive inductor information and operating conditions input by the user into the input interface 102 and communicate this data to the server computer 114 for analysis. The server computer 114 may serve as an analysis engine and process the comparison and send the results to the user device 104 for display to the user via the application.

Figure 3A:
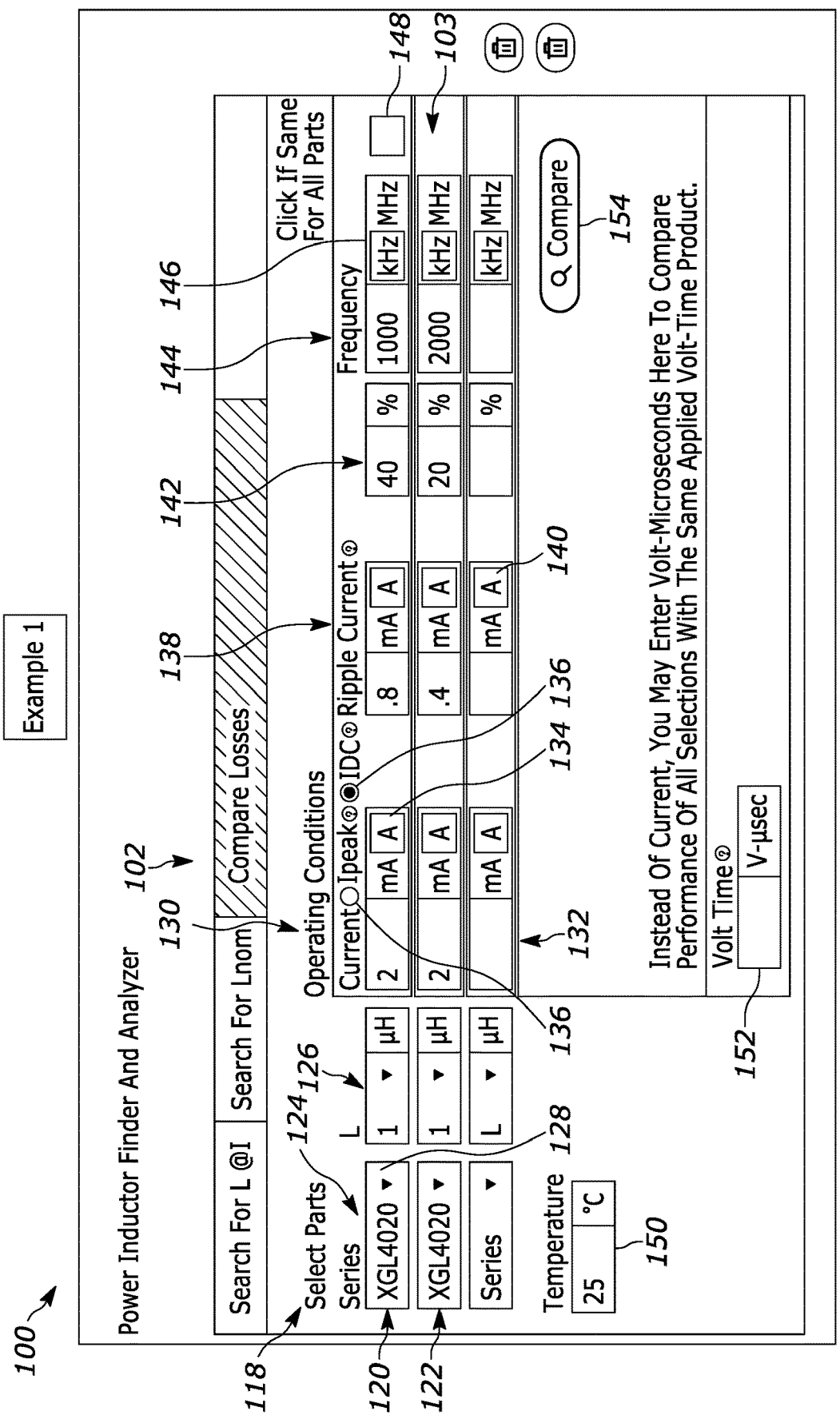
FIG. 3A is an example input interface of the inductor comparison system of FIG. 1 with input to compare the same inductors at different operating conditions.

With reference to FIG. 3A, the input interface 102 includes an input table 103 having a part selection section 118 and an operating conditions section 130. The part selection section 118 of the input table 103 is where a user may enter data about the inductor parts to be compared. Information for a first inductor to be compared may be entered into a first row 120, information for a second inductor may be entered into a second row 122, and so on. While three rows are shown, the input table 103 may include any number of rows for simultaneously comparing inductors. In one form, the input interface 102 includes a button (e.g., an "add row" or "+" button) for adding additional rows to the input table 103 when a user would like to compare additional inductors.

The part selection section 118 includes a first column 124 into which a user may enter a type of inductor to be compared into each row and a second column 126 into which a user may enter an inductance value for the inductors in the first column 124. The inductor comparison tool 100 may include a database or table stored in memory having additional details about each inductor type, for example, operating characteristics, physical parameters, and/or other specifications of various models of inductors. When the user inputs an inductor type (e.g., a model number) into a cell in the first column 124, the inductor comparison tool 100 may reference this database to retrieve additional data corresponding to the inductor type for the comparison.

The user may enter information into each cell 128 of the part selection section 118 for the comparison. The cells are input boxes that a user may select to enter information into the selected cell 128. For the cells 128 in the first column 124 for inputting an inductor type, in one form, a user may select the cell and enter the name of a type of inductor (e.g., a model number) the user desires to be included in the comparison. In some forms, a user may click on the cell 128 to cause the input interface 102 to present the user with a list of the types of inductors a user may select from. The input interface 102 may present the list of inductor types in a dropdown menu or may open a new window that presents the list to the user. In one form, the user may enter the type of inductor by typing the inductor type using a virtual or physical keyboard. In one form, the user may enter the type of inductor by speaking the inductor type into a microphone of the user device. The inductor comparison tool 100 may include voice recognition software for translating the user's spoken inputs into text to be entered into the selected cell. The inductance values may similarly be entered into the cells 128 in the second column 124.

The operating conditions section 130 of the input table 103 is where a user may enter operating condition data for each of the inductors to be compared. Operating condition data for the first inductor in the first row 120 may be entered into the first row 120 of the operating condition section 130, operating condition data for the second inductor in the second row 122 may be entered into the second row 122, and so on. In the example shown, the inductor comparison tool 100 permits the user to input information pertaining to the current, the ripple current, the ripple current percentage, and switching frequency although in other embodiments fewer or additional types of conditions may be used. It should be understood that various operating conditions can be used for the design tool (e.g., waveshape of the ripple current (i.e., like choosing between triangle wave, sine wave or other wave pattern), duty cycle of the current (i.e., percentage of time the current flows through the inductor which could range from 100% for a continuous current to any number between zero and 100% for an interrupted or discontinuous current flow), etc.

The operating conditions section 130 includes a third column 132 into which a user may enter a current in each row corresponding to the current experienced by the corresponding inductor. The user may select the cell of the desired row and enter a current value by typing or speaking the value as discussed above. The operating conditions section 130 may further provide the user with a toggle button 134 where the user can select the units for the value entered in the cell, for example, where the user can toggle between milliamps or amps. The operating conditions section 130 may also provide the user with radio buttons 136 where the user can select to enter the current information in the form of a peak current (Ipeak) (e.g., the highest current experienced by the inductor) or the DC current (IDC) (e.g., the average current experienced by the inductor).

The operating conditions section 130 includes a fourth column 138 into which a user may enter a ripple current value in each row corresponding to the amount of ripple current experienced by the corresponding inductor. The ripple current is the variation in the DC current during a switching cycle. The operating conditions section 130 may further provide the user with a toggle button 140 where the user can select the units for the value entered in the cell, for example, where the user can toggle between milliamps or amps. The operating conditions section 130 includes a fifth column 142 into which a ripple current percentage value may be entered for each inductor. The ripple current may be described relatively as a percentage of the average current or absolutely in units of current (amperes). In the example shown, the ripple current can be designated, for example, as 1 ampere or as 10% of the average current. Knowing any two of average current, ripple current, and percent, the third can be calculated and filled in by the tool. In other words, the user will typically enter the average current and either the ripple current value or ripple current percentage. The non-entered number can be automatically populated by the tool. While the ripple current value and percentage are essentially the same thing, it is useful to offer either as potential input as sometimes the user knows the value, but other times a typical rule-of-thumb is followed as a design starting point like "ripple current=40% of average current".

The operating conditions section 130 includes a sixth column 144 into which a switching frequency value may be entered for each inductor. The operating conditions section 130 may further provide the user with a toggle button 146 where the user can select the units for the value entered in the cell, for example, where the user can toggle between kHz or MHz.

The operating conditions section 130 may provide an input box 148 that a user may select upon entering values into the first row 120 to indicate that the operating conditions for all of the compared inductors (e.g., those in the first, second, and any subsequent rows) will be the same. Upon selecting the input box 148, the user need not retype all of the operating condition data into the subsequent rows for the comparison. In the form shown, when the input box 148 has been selected, the input interface 102 grays out the cells in the second and third rows of the operating conditions section 130 of the table 103 so that the user is not able to enter additional data into those cells (see FIG. 1). In other forms, other graphical user interface input features may be used to indicate whether the operating conditions will be the same for all compared inductors. For example, the toggle switch button may be used to indicate whether the operating conditions will be the same for all inductors.

The input interface 102 further may include an input box 150 where a user may enter a temperature at which the inductors will be operating. In the form shown, the user enters the temperature in Celsius. In other forms, the input interface 102 provides an input button (e.g., radio button or toggle button) allowing the user to select the units for entered temperature value (e.g., Celsius, Fahrenheit, Kelvin). In some forms, the temperature is another column in the operating conditions section 130 of the input table 103 so that the temperature may be different across the compared inductors, if desired.

The input interface 102 further may include an input box 152 where a user may enter a volt-microseconds value to use instead of the current values of the third column 132. The inductor comparison tool 100 may apply the entered volt-microseconds value to all inductors included in the comparison.

Figure 3B:
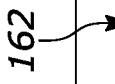
FIG. 3B is an example results table output by the inductor comparison system of FIG. 1 based on the input of FIG. 3A.

Once the user has entered the information into the input table 103 of the input interface 102 for the inductor comparison, the user may select a compare button 154 to submit the data for processing and to receive the results. With respect to FIG. 3B, upon the user selecting the compare button 154, the inductor comparison tool 100 processes the inductor data and corresponding operating conditions for each inductor to calculate one or more performance characteristics or parameters for each inductor under the selected operating conditions. The inductor comparison tool 100 may then compile the calculated performance characteristics into a results table and output the table to the user for review. An example of a results table 156 is shown in FIG. 3B. The results table 156 includes two rows 158, 160 corresponding to the two inductors entered in the input table 103. Where three or more inductors are entered into the input table 103, the results table 156 will include a number of rows corresponding to the number of inductors entered by the user into the input table 103. For each inductor, the results table presents specification data about the selected inductor (e.g., the dimensions of the component, core material, max temperature rating, etc.), the input operating conditions, and the estimated or calculated performance characteristics. In the example shown, the results table includes a total losses column 162 including information relating to the calculated losses for the selected inductor at the selected operating conditions. Other calculated performance values may include the dc resistance (DCR) (which is calculated based on the user-inputted temperature), and the part temperature (Part Temp) (which is calculated based on the Total Losses). In some forms, the results table 156 may include a column for the efficiency of the selected inductors. Other examples of values that could be calculated based on the operating conditions may include total losses (which consist of ac losses and dc losses that are both calculated and usually shown in this table by means of a mouse "hover" (meaning positioning the icon/gui associate with the mouse over this portion of the table will cause the additional data to be displayed).

The inductor comparison tool 100 may calculate the performance characteristics for each inductor based on data stored in a database for each inductor. For example, the inductor comparison tool 100 may reference performance charts, graphs, and/or data for the selected inductor. The performance charts, graphs, and/or data may include performance curves, data, or equations generated by testing the inductor at varying operating conditions and storing the data. The performance charts, graphs, and/or data may be the data provided with a provided in a datasheet for the inductor. The inductor comparison tool 100 may pull this data from the data sheet such that the user does not have to manually look at the datasheets for each inductor individually at the various desired operating conditions to determine the performance characteristics and to make a comparison.

In the example of FIGS. 3A-3B, values have been entered to compare the same inductor under two different operating conditions. More specifically, the values entered into the first and second rows 120, 122 of the parts selection section 130 of the input interface 102 are the same, while the values entered for the ripple current and switching frequency are different. In this particular example, the inductors performances are compared at two different switching frequencies. By way of example, for many buck converters, the resulting ripple current is inversely proportional to switching frequency and thus in this example the switching frequency of 1 MHz is compared to 2 MHz while the ripple current is compared, respectively, at 8 A and 4 A. The user is, however, free to enter operating condition values appropriate to a particular circuit. In the results table 156, the inductor in the first row 120 has total losses of 36 mW while the inductor in the second row 122 has total losses of 35 mW. A user may use this information, for example, to make a selection of an inductor when designing a circuit. For instance, a user may user the inductor comparison tool 100 to determine whether a particular inductor will be able to perform as desired under various operating conditions the inductor will experience as part of the circuit and/or to determine which inductor will perform better.

Figure 4:
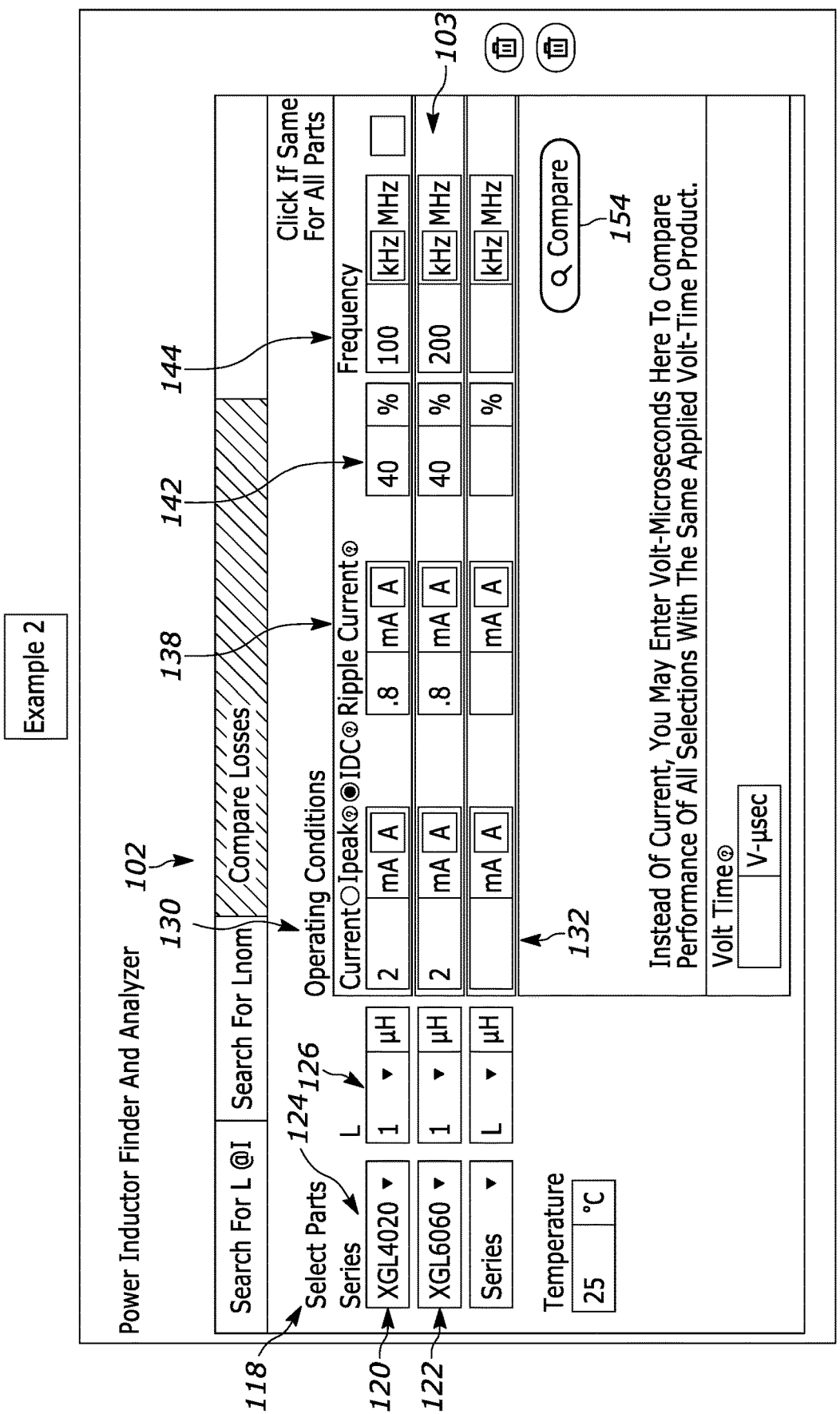
FIG. 4 is an example input interface of the inductor comparison system of FIG. 1 with input to compare similar inductors under different operating conditions.

In the example of FIG. 4, values have been entered into the input interface 102 to compare two different inductors of similar inductance under different operating conditions. In particular, the inductor entered in the first row 120 is model number XGL4020 with operating conditions including a switching frequency of 100 kHz, whereas the inductor entered into the second row 122 is model number XAL6060 with operating conditions including a switching frequency of 200 kHz. A designer is thus able to compare the performance characteristics for each of the different inductors at the respective different switching frequencies. The user may be presented with a results table as discussed above with calculated performance parameters for each inductor at the selected operating conditions that the user may use to evaluate which inductor is better for their particular circuit.

Figure 5:
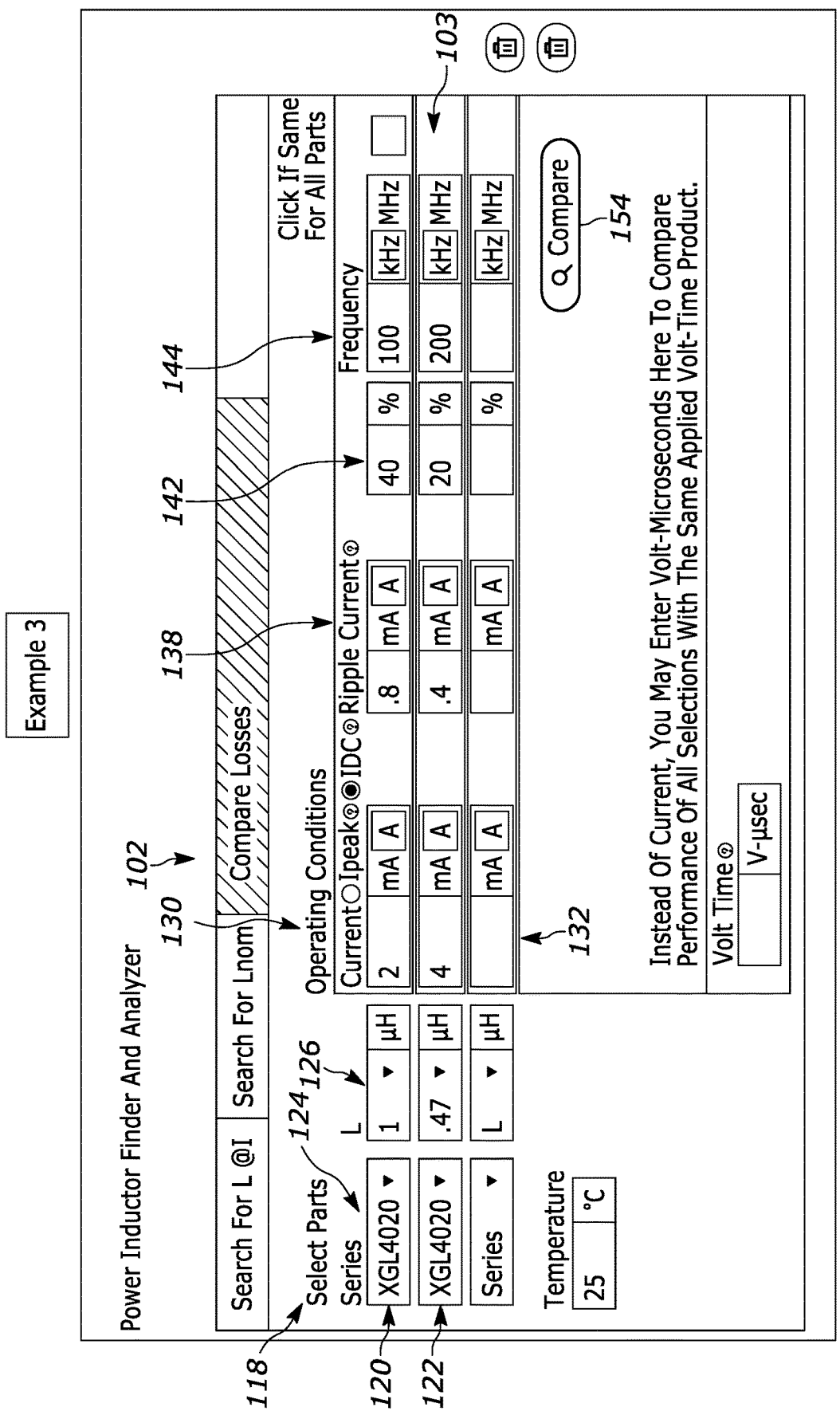
FIG. 5 is an example input interface of the inductor comparison system of FIG. 1 with input to compare different inductors under different operating conditions.
Figure 6:
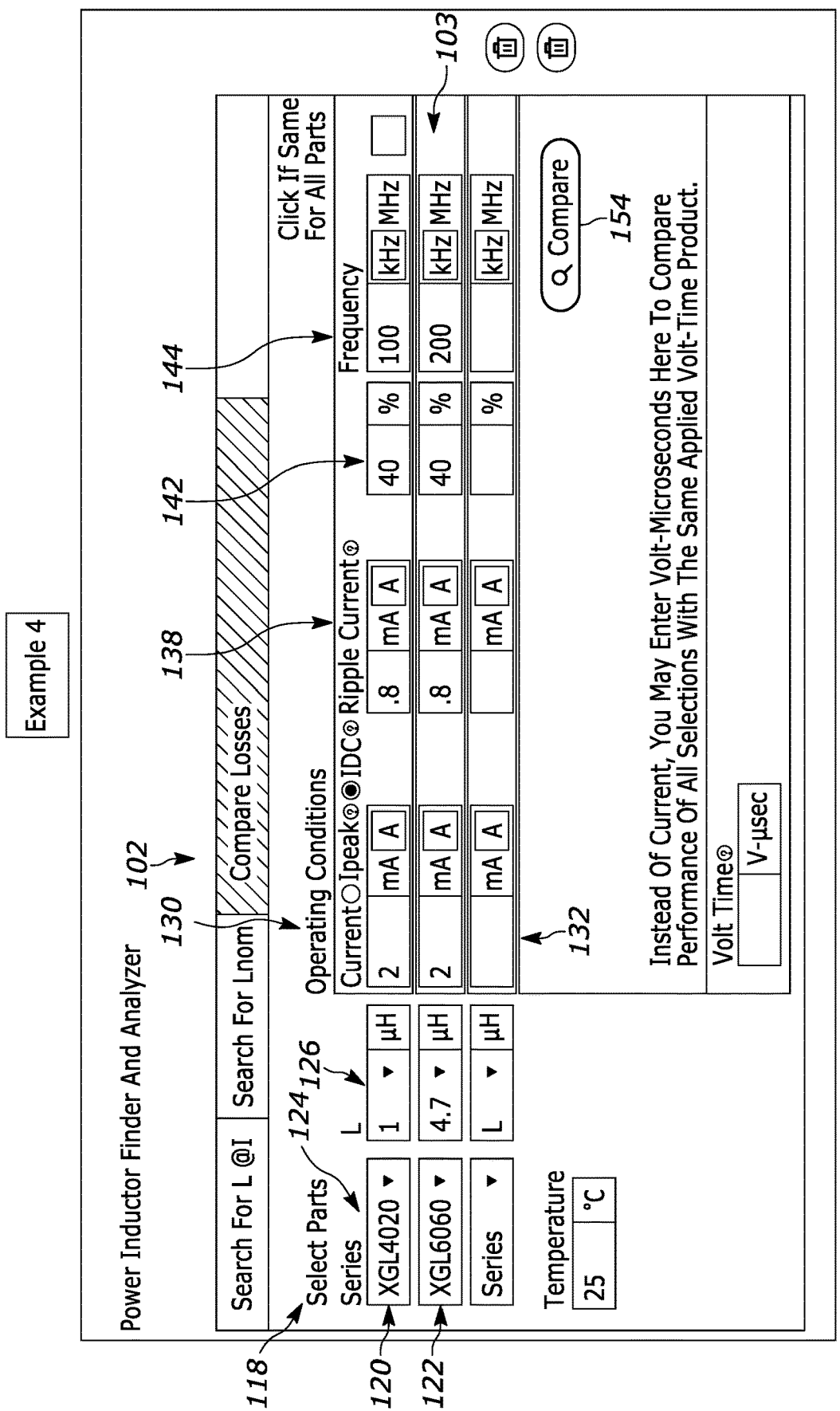
FIG. 6 is an example input interface of the inductor comparison system of FIG. 1 with input to compare different inductors with some different and some similar operating conditions.

In the example of FIG. 5, values have been entered into the input interface 102 to compare two inductors of different inductances at all different operating conditions. In the example of FIG. 6, values have been entered for two different inductors of different inductances under slightly different operating conditions. More particularly, some of the operating conditions are the same while some, such as the switching frequencies, are different. In each example, the user may be presented with a results table with the calculated performance parameters to evaluate whether the inductors may perform as needed for their particular circuit.

The inductor comparison tool 100 thus allows a user to compare the performance of the same or different inductors to compare two or more inductors, for example, for use in a circuit. The inductor comparison tool 100 further enables the user to compare the inductors under the same or different operating conditions. For example, the user can enter slightly different operating conditions or entirely different operating conditions for the comparison.

Uses of singular terms such as "a," "an," are intended to cover both the singular and the plural, unless otherwise indicated herein or clearly contradicted by context. The terms "comprising," "having," "including," and "containing" are to be construed as open-ended terms. It is intended that the phrase "at least one of" as used herein be interpreted in the disjunctive sense. For example, the phrase "at least one of A and B" is intended to encompass A, B, or both A and B.

While there have been illustrated and described particular embodiments of the present invention, it will be appreciated that numerous changes and modifications will occur to those skilled in the art, and it is intended for the present invention to cover all those changes and modifications which fall within the scope of the appended claims.

What is claimed is:

1. An apparatus for comparing inductor performance, the apparatus comprising:
 a processor configured to:
  receive input of a first inductor and a first operating condition;
  receive input of a second inductor and a second operating condition, the second operating condition different from the first operating condition;
  estimate a first inductor performance characteristic based at least in part on the first inductor and the first operating condition;
  estimate a second inductor performance characteristic based at least in part on the second inductor and the second operating condition; and
  output, via a user interface, the first inductor performance characteristic and the second inductor performance characteristic,
 wherein to estimate the first inductor performance characteristic includes identifying the first inductor performance characteristic in a database based at least in part on the first inductor and first inductor operating condition.

2. The apparatus of claim 1 wherein the first inductor is different from the second inductor.

3. The apparatus of claim 1 wherein the processor is further configured to present, via the user interface, an input interface for receiving the input of the first inductor and the first operating condition and the input of the second inductor and the second operating condition.

4. The apparatus of claim 1 wherein first operating condition includes a peak current, an average current, a switching frequency, a ripple current, and/or a volt time.

5. The apparatus of claim 1 wherein the first operating condition includes a first switching frequency, and the second operating condition includes a second switching frequency different from the first switching frequency.

6. The apparatus of claim 1 wherein to receive input of the first inductor includes receiving at least one of an inductor type and an inductance of the first inductor.

7. The apparatus of claim 1 wherein to output the first inductor performance characteristic and second inductor performance characteristic includes presenting the first inductor performance characteristic and second inductor performance characteristic together on a display screen.

8. The apparatus of claim 1 wherein to output the first inductor performance characteristic and second inductor performance characteristic includes presenting a comparison results table including information relating to the first inductor, first operating condition, and first inductor performance characteristic along with information relating to the second inductor, second operating condition, and second inductor performance characteristic.

9. An input interface of an inductor comparison tool, the input interface comprising:
   a first inductor input for inputting component information pertaining to a first inductor;
   a first operating condition input for inputting a first operating condition for the first inductor;
   a second inductor input for inputting component information pertaining to a second inductor;
   a second operating condition input for inputting a second operating condition for the second inductor; and
   a compare button which when selected causes the inductor comparison tool to output, via an output interface, a first inductor performance characteristic for the first inductor based at least in part on the first operating condition and a second inductor performance characteristic for the second inductor based at least in part on the second operating condition.

10. The input interface of claim 9 further comprising an input table having a first row including the first inductor input and first operating condition input and a second row including the second inductor input and second operating condition input.

11. The input interface of claim 10 wherein the input table includes at least one column including the first operating condition input and second operating condition input.

12. The input interface of claim 9 wherein first operating condition includes a peak current, an average current, a switching frequency, a ripple current, and/or a volt time.

13. The input interface of claim 9 wherein the first inductor input includes an first inductor type input and a first inductor inductance input.

14. The input interface of claim 9 wherein selecting the compare button causes the component information entered in the first inductor input, the first operating condition entered in the first operating condition input, the component information entered in the second inductor input, and the second operating condition entered in the second operating condition input to be sent to a processor to estimate the first inductor performance characteristic and second inductor performance characteristic.

15. The input interface of claim 9 further comprising an input selectable to indicate that the second operating condition is the same as the first operating condition.

16. A method for comparing inductor performance, the method comprising:
   at a processor:
   receiving, via an input interface, input of a first inductor and a first operating condition;
   receiving, via the input interface, input of a second inductor and a second operating condition, the second operating condition different from the first operating condition;
   estimating a first inductor performance characteristic based at least in part on the first inductor and the first operating condition;
   estimating a second inductor performance characteristic based at least in part on the second inductor and the second operating condition; and
   outputting, via a user interface, the first inductor performance characteristic and second inductor performance characteristic,
   wherein the first operating condition includes a first switching frequency, and the second operating condition includes a second switching frequency different from the first switching frequency.

17. The method of claim 16 wherein the first inductor is different from the second inductor.

18. The method of claim 16 further comprising presenting, via the user interface, an input interface for receiving the input of the first inductor and the first operating condition and the input of the second inductor and the second operating condition.

19. The method of claim 16 wherein estimating the first inductor performance characteristic includes identifying the first inductor performance characteristic in a database based at least in part on the first inductor and first inductor operating condition.

20. The method of claim 16 wherein the first operating condition includes a peak current, an average current, a switching frequency, a ripple current, and/or a volt time.

21. The method of claim 16 wherein receiving input of the first inductor includes receiving at least one of an inductor type and an inductance.

22. The method of claim 16 wherein outputting the first inductor performance characteristic and second inductor performance characteristic includes presenting the first inductor performance characteristic and second inductor performance characteristic together on a display screen of the user interface.

23. The method of claim 16 wherein outputting the first inductor performance characteristic and second inductor performance characteristic includes presenting a comparison results table including information relating to the first inductor, first operating condition, and first inductor performance characteristic along with information relating to the second inductor, second operating condition, and second inductor performance characteristic.

24. A method for selecting an electronic component for a particular application comprising:
   providing a user interface that allows a user to enter operating conditions relating to a plurality of electronic components including at least a first electronic component and a second electronic component;
   presenting an option to the user via the user interface selectable to either apply the same operating conditions to the plurality of electronic components or to independently enter operating conditions for each of the plurality of electronic components such that separate operating conditions are able to be entered for the first electronic component and the second electronic component;

determining performance parameters for each electronic component of the plurality of electronic components based on stored performance data of the electronic component and the entered operating conditions; and displaying the determined performance parameters for the plurality of electronic components via the user interface so that the performance parameters are able to be compared together.

\* \* \* \* \*